United States Patent
Yamabe et al.

(10) Patent No.: US 10,332,904 B2
(45) Date of Patent: Jun. 25, 2019

(54) SEMICONDUCTOR MEMORY DEVICE AND METHOD FOR MANUFACTURING SAME

(71) Applicant: Toshiba Memory Corporation, Minato-ku (JP)

(72) Inventors: Kazuharu Yamabe, Yokkaichi (JP); Ryota Suzuki, Yokkaichi (JP); Tatsuo Izumi, Yokkaichi (JP); Masahiro Fukuda, Kuwana (JP); Takuo Ohashi, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 120 days.

(21) Appl. No.: 15/457,396

(22) Filed: Mar. 13, 2017

(65) Prior Publication Data
US 2018/0083027 A1    Mar. 22, 2018

Related U.S. Application Data

(60) Provisional application No. 62/397,119, filed on Sep. 20, 2016.

(51) Int. Cl.
*H01L 27/1157* (2017.01)
*H01L 27/11582* (2017.01)
*H01L 21/02* (2006.01)

(52) U.S. Cl.
CPC .... *H01L 27/11582* (2013.01); *H01L 21/0217* (2013.01); *H01L 21/02164* (2013.01); *H01L 27/1157* (2013.01); *H01L 21/02326* (2013.01)

(58) Field of Classification Search
CPC ........... H01L 27/11582; H01L 27/1157; H01L 21/02164; H01L 23/5283; H01L 21/0217; H01L 21/02326
See application file for complete search history.

(56) References Cited

U.S. PATENT DOCUMENTS

2009/0283819 A1*  11/2009  Ishikawa ........... H01L 21/28282
                                                                257/324
2012/0083077 A1   4/2012  Yang et al.
2012/0267699 A1  10/2012  Kiyotoshi

FOREIGN PATENT DOCUMENTS

JP    2012-80105     4/2012
JP    2012-227326    11/2012

OTHER PUBLICATIONS

Jianan Yang, et al. "Electrical effects of a single stacking fault on fully depleted thin-film silicon-on-insulator P-channel metal-oxide-semiconductor field-effect transistors", Journal of Applied Physics, vol. 91, No. 1, 2002, 8 pages.

* cited by examiner

*Primary Examiner* — Kyoung Lee
(74) *Attorney, Agent, or Firm* — Oblon, McClelland, Maier & Neustadt, L.L.P.

(57) ABSTRACT

A semiconductor memory device includes a conductive layer; a first electrode layer provided above the conductive layer; a second electrode layer provided between the conductive layer and the first electrode layer; a first semiconductor channel body extending through the first electrode layer in a first direction from the conductive layer to the first electrode layer; a second semiconductor channel body provided between the conductive layer and the first semiconductor channel body, the second semiconductor channel body extending through the second electrode layer; and an insulating layer provided between the second semiconductor channel body and the second electrode layer. The second semiconductor channel body includes a first recessed portion in a lateral surface facing the second electrode layer, and the second electrode layer includes a second recessed portion in a surface facing the second semiconductor channel body.

6 Claims, 13 Drawing Sheets

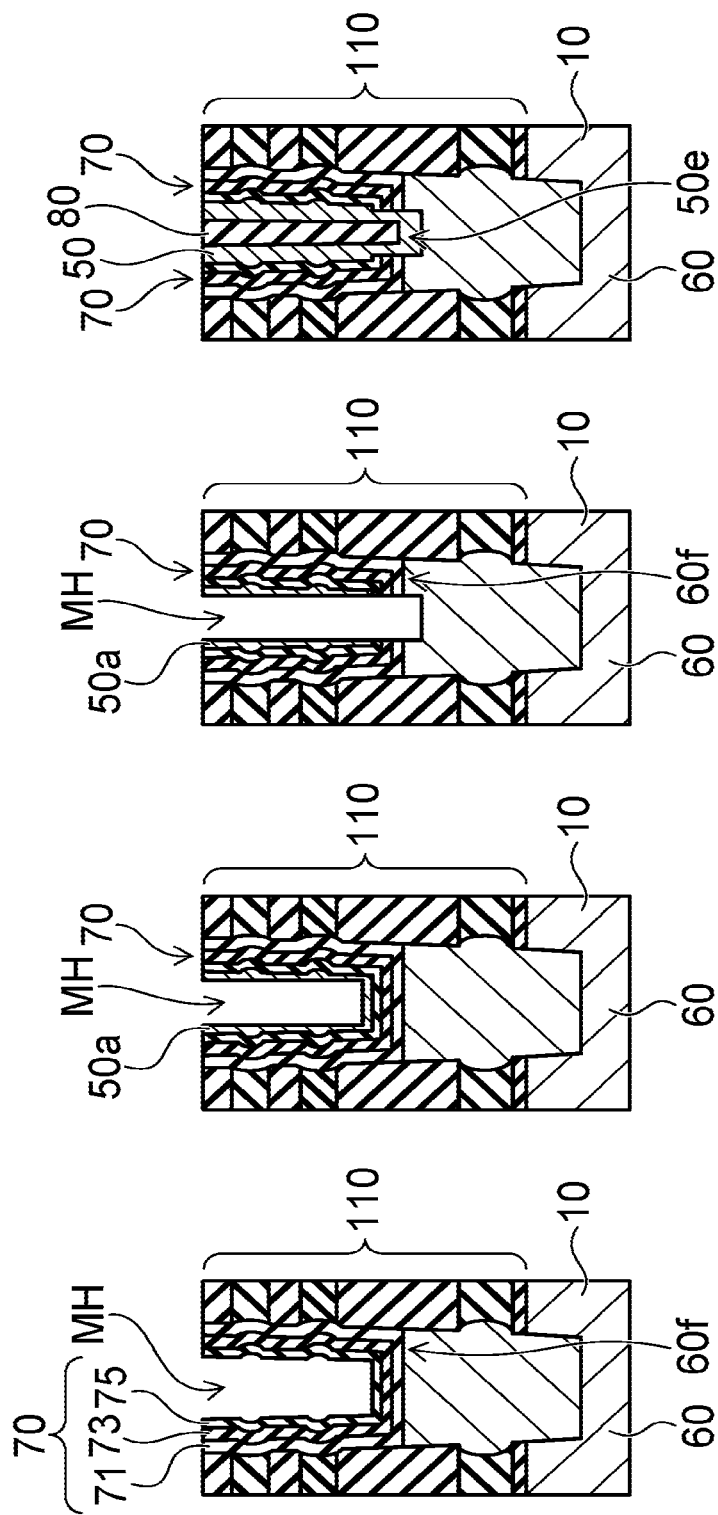

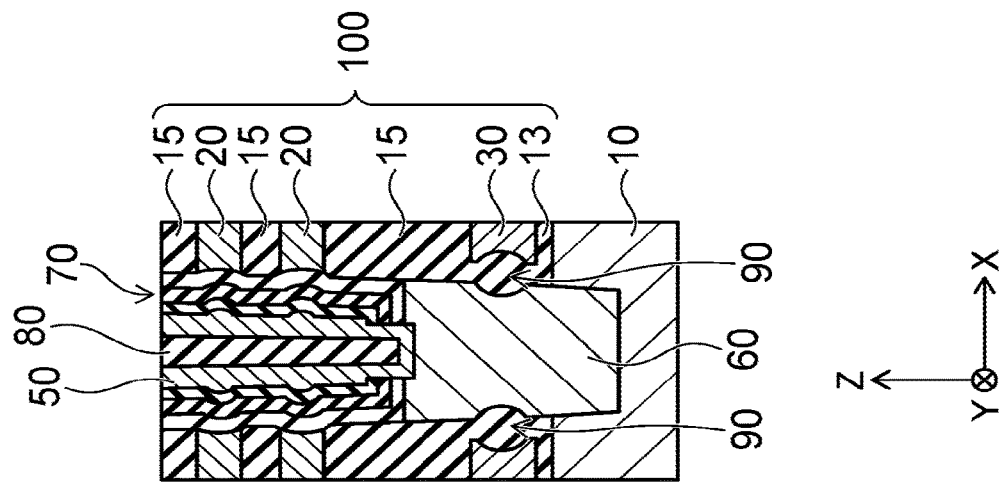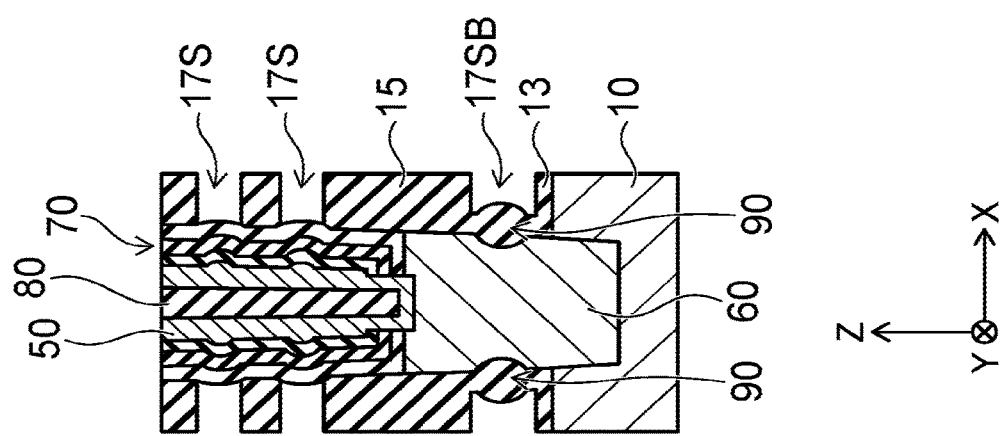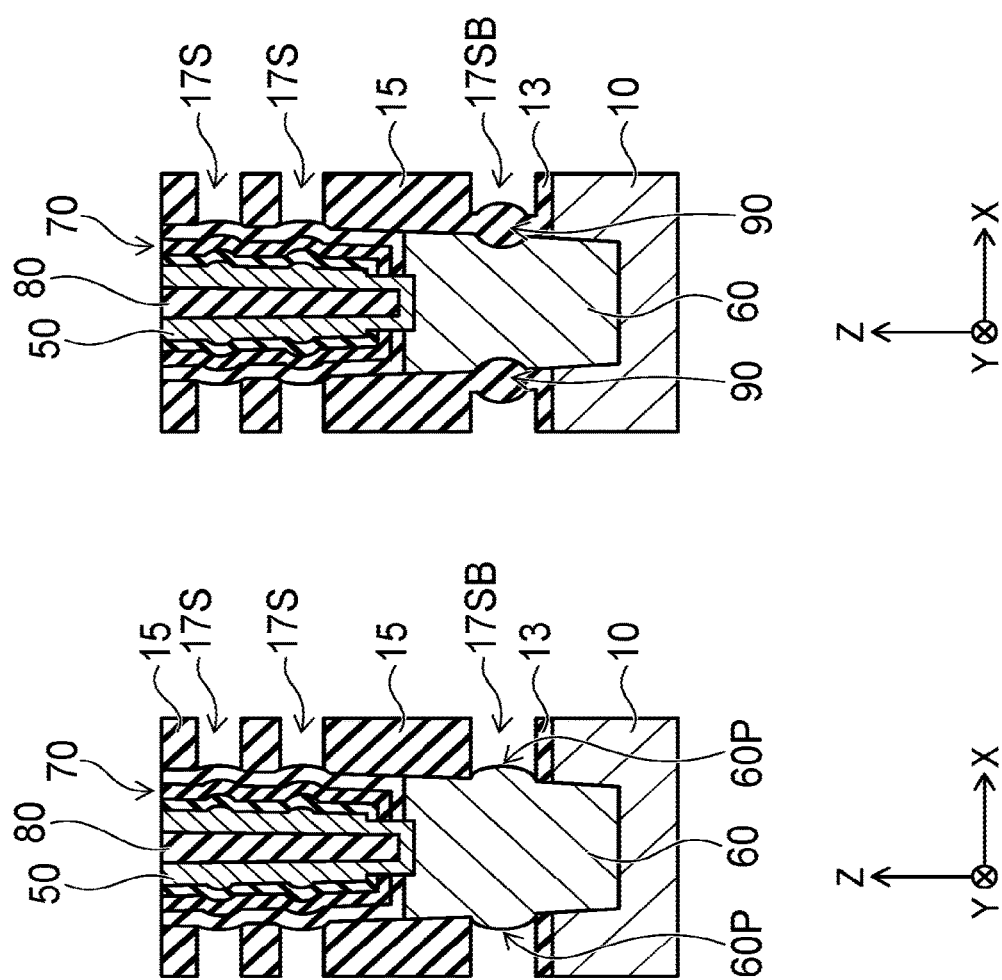

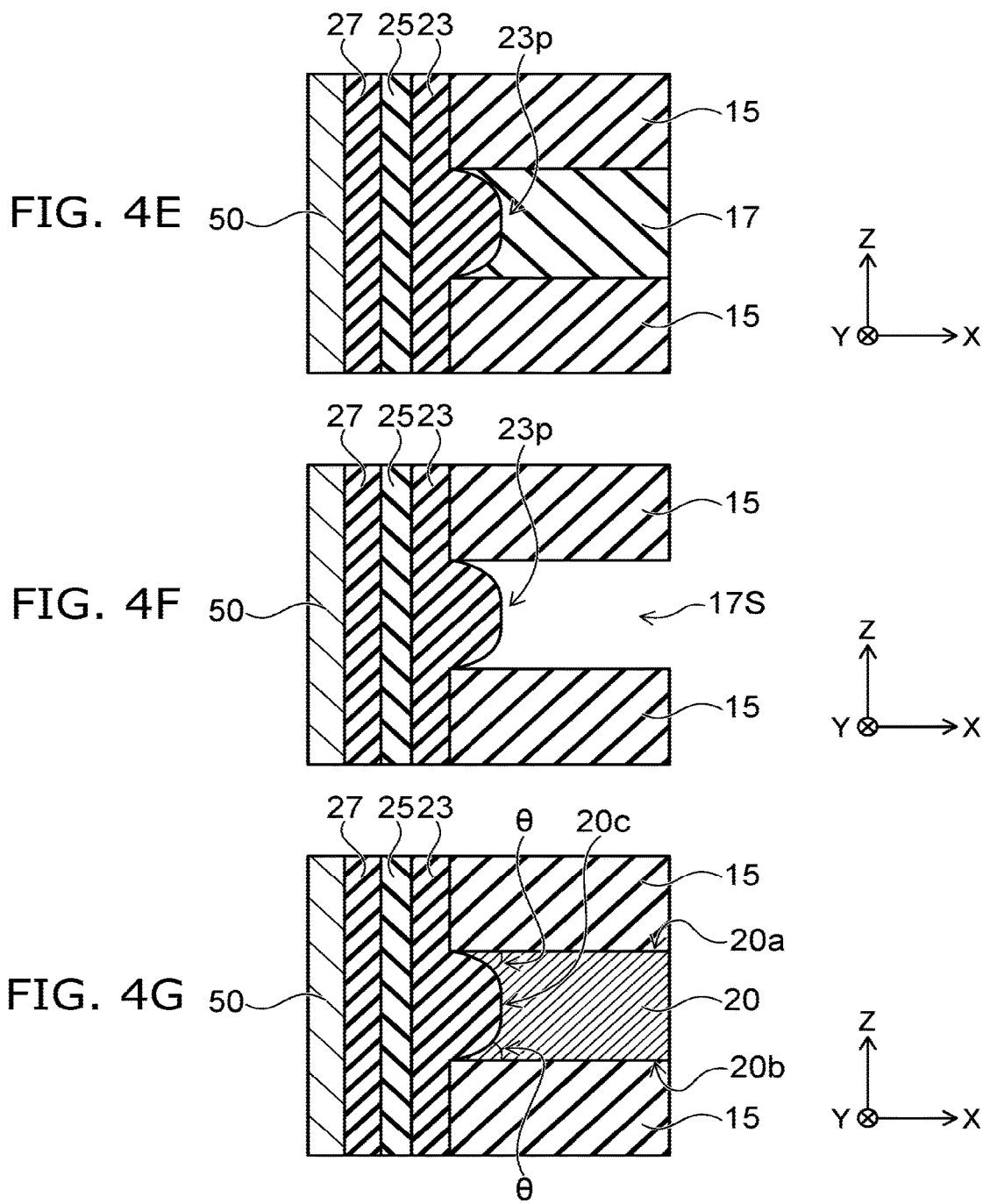

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/397,119 filed on Sep. 20, 2016; the entire contents of which are incorporated herein by reference.

FIELD

Embodiments are generally related to a semiconductor memory device and a method for manufacturing the same.

BACKGROUND

A semiconductor memory device, for example, a NAND type memory device, which includes three dimensionally arranged memory cells, for example, comprises a plurality of electrode layers stacked on a substrate and a semiconductor layer extending therethrough. The memory cells are provided at parts respectively, where the semiconductor layer intersects each electrode layer. When the structure is miniaturized in such a memory device, defects are likely to be generated in the semiconductor layer through the manufacturing process, resulting in a reduction of manufacturing yield. Consequently, a large number of memory cells may have electrical deviations induced in device characteristics such as threshold voltage. Thus, there is a demand for the structure where fewer defects are generated in the course of miniaturization, and thereby, the reliability of the semiconductor memory device can be improved.

BRIEF DESCRIPTION OF THE DRAWINGS

FIGS. 3A to 3J are schematic cross-sectional views showing a manufacturing process of the semiconductor memory device according to the first embodiment;

FIGS. 4A to 4G are schematic cross-sectional views showing a manufacturing process of a semiconductor memory device according to a second embodiment;

DETAILED DESCRIPTION

Figure 1:
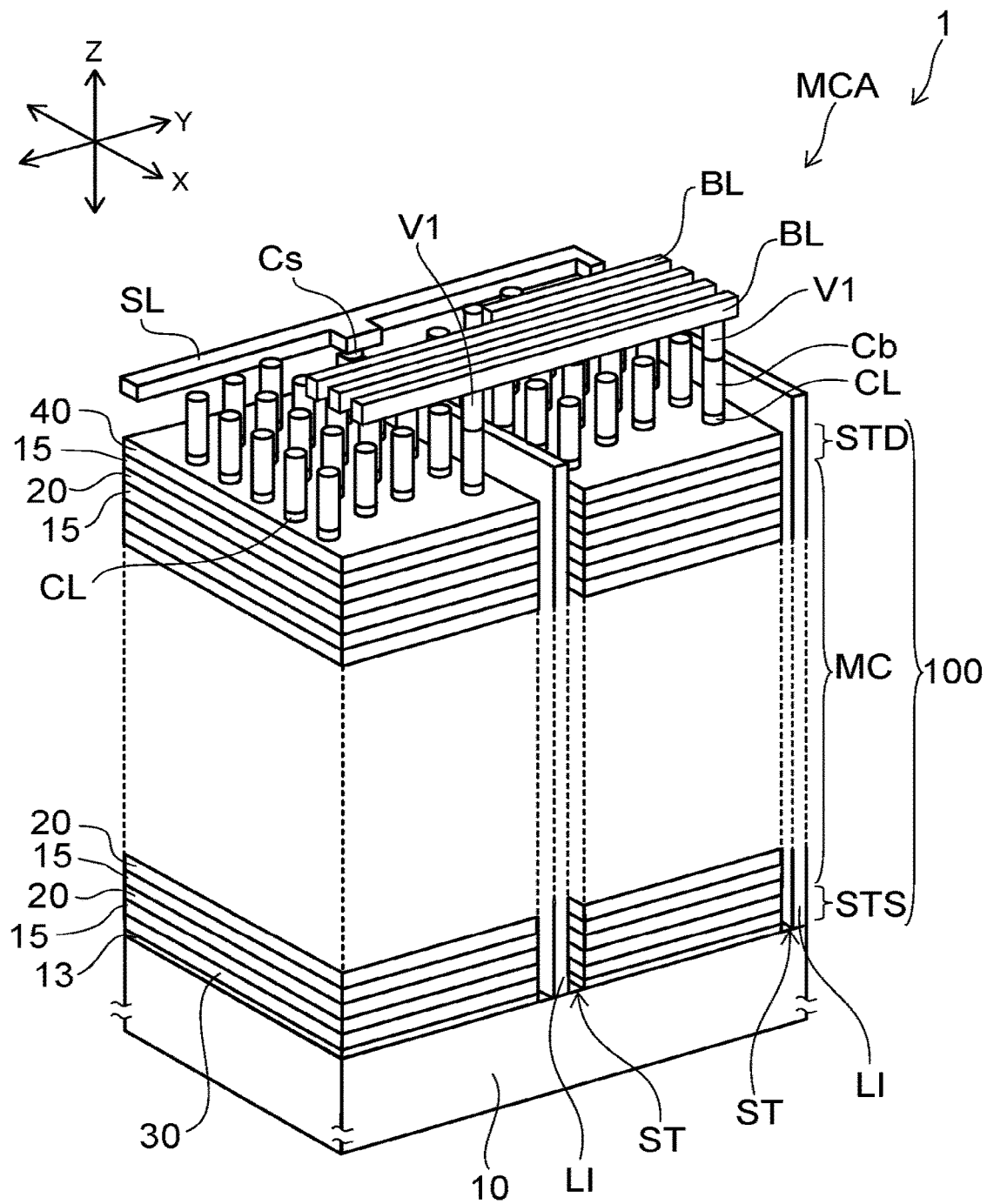
FIG. 1 is a perspective view schematically showing a semiconductor memory device according to a first embodiment.

According to one embodiment, a semiconductor memory device includes a conductive layer; a first electrode layer provided above the conductive layer; a second electrode layer provided between the conductive layer and the first electrode layer; a first semiconductor channel body extending through the first electrode layer in a first direction from the conductive layer to the first electrode layer; a second semiconductor channel body provided between the conductive layer and the first semiconductor channel body, the second semiconductor channel body extending through the second electrode layer; and an insulating layer provided between the second semiconductor channel body and the second electrode layer. The second semiconductor channel body includes a first recessed portion in a lateral surface facing the second electrode layer, and the second electrode layer includes a second recessed portion in a surface facing the second semiconductor channel body.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a memory cell array MCA of a semiconductor memory device 1 according to the first embodiment. The semiconductor memory device 1 is, for example, a NAND type memory device and includes three-dimensionally arranged memory cells MC.

As shown in FIG. 1, the semiconductor memory device 1 includes, for example, a source layer 10 provided on a silicon substrate (not shown) and a stacked body 100. On the source layer 10, a plurality of stacked bodies 100 are arranged, for example, in the Y-direction. Adjacent stacked bodies 100 are separated in the Y-direction by the slit space SL. The stacked body 100 includes a plurality of electrode layers (hereinafter, word lines 20, selection gates 30 and 40) stacked in the Z direction.

The selection gate 30 is provided on the source layer 10 with the insulating layer 13 interposed. The word line 20 is stacked on the selection gate 30. The interlayer insulating layers 15 are provided respectively between the selection gate 30 and the lowermost word line 20 and between adjacent word lines 20 in the Z direction. The selection gate 40 is provided on the uppermost word line 20 with other interlayer insulating layer 15 interposed.

The source layer 10 is, for example, a P-type well provided in a silicon substrate. The word line 20 and the selection gates 30 and 40 are, for example, a metal layer or a low resistance polycrystalline silicon layer. The insulating layers 13 and 15 are, for example, silicon oxide layers.

The stacked body 100 includes, for example, a plurality of columnar bodies CL extending in the Z direction through the word lines 20 and the selection gate 40. Each of the columnar bodies CL includes a semiconductor channel body (see FIG. 2A, hereinafter, a channel body 50). Moreover, the stacked body 100 includes, for example, another semiconductor channel body (hereinafter, a channel body 60) positioned between the columnar body CL and the source layer 10 and extending in the Z direction through the selection gate 30.

The memory cell array MCA includes a plurality of stacked bodies 100, and includes a plurality of memory cells MC, selection transistors STS and STD arranged along the columnar bodies CL. The memory cells MC are provided at portions respectively where the columnar bodies CL intersect the word lines 20. A selection transistor STS is provided at a portion where a channel body 60 intersects a selection gate 30, and a selection transistor STD is provided at a portion where a columnar body CL intersects the selection gate 40.

The semiconductor memory device 1 further includes bit lines BL and a source line SL. The bit lines BL and the source line SL extend, for example, in the Y direction above the stacked bodies 100. A bit line BL is electrically connected to the channel body 50 in a columnar body CL via contact plugs Cb and V1. The source line SL is electrically connected to the source layer 10, for example, via conductors LI. For example, the conductors LI are provided with a plate shape extending in the X direction and the Z direction inside the slit space SL, and are electrically connected to the source line SL via contact plugs Cs.

Figure 2A:
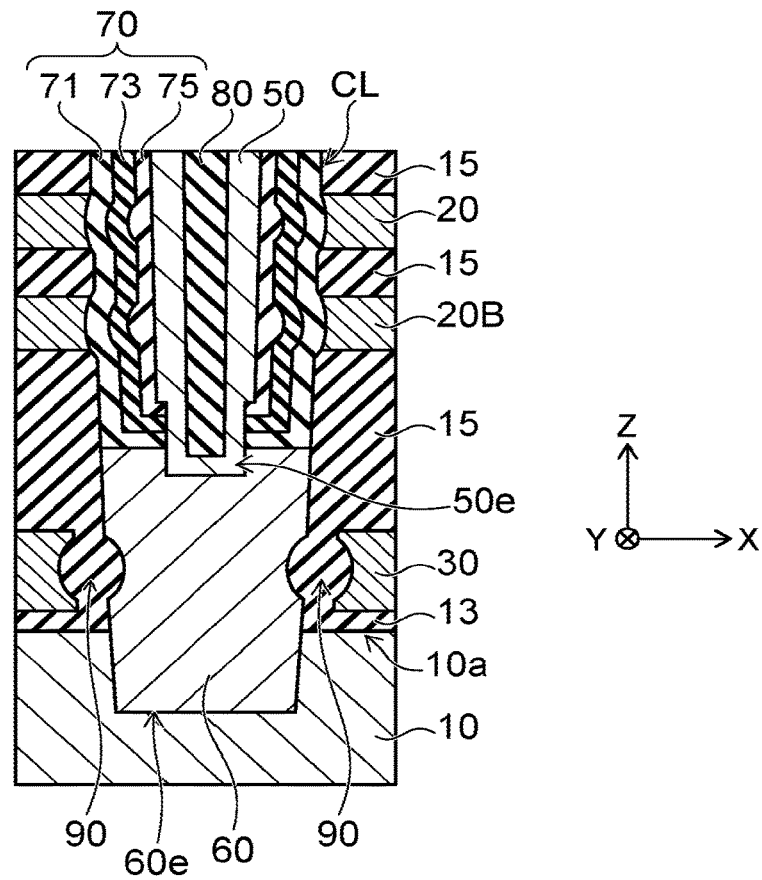
FIGS. 2A and 2B are schematic cross-sectional views showing a semiconductor memory device according to the first embodiment.
Figure 2B:
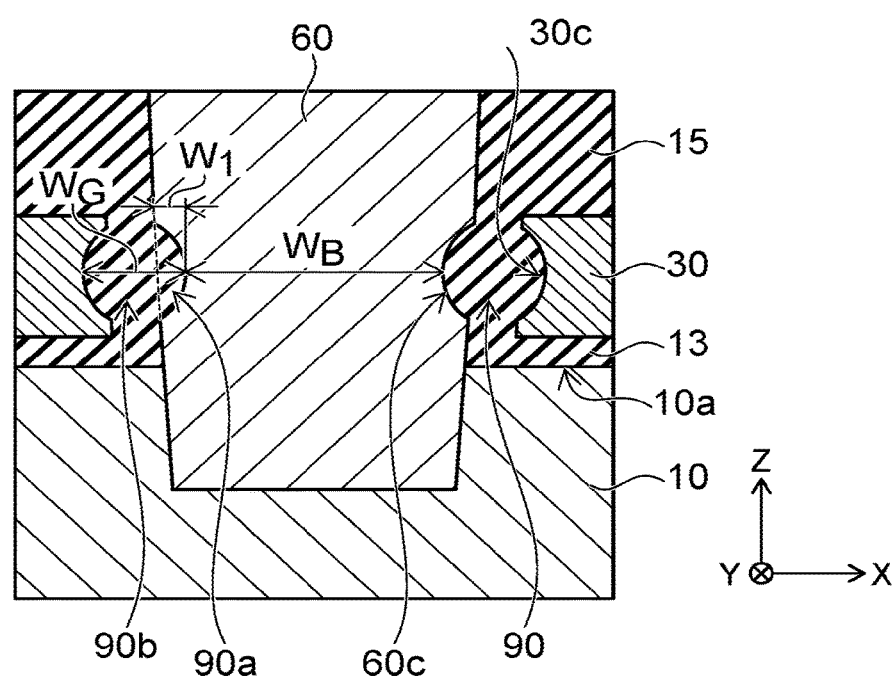

FIGS. 2A and 2B are schematic cross-sectional views showing a semiconductor memory device according to the first embodiment. FIG. 2A is a schematic cross-sectional view showing the columnar body CL and the channel body 60. FIG. 2B is a schematic cross-sectional view showing a structure of the selection transistor STS on a source side between the source layer 10 and the columnar section CL.

As shown in FIG. 2A, the columnar body CL extends through the word lines 20 in the Z direction. The channel body 60 extends in the Z direction through the selection gate 30. Moreover, the columnar body CL extends in the Z direction through the selection gate 40 at a portion not shown.

The columnar body CL includes, for example, a channel body 50, a memory layer 70, and an insulating core 80. The insulating core 80 is, for example, silicon oxide and extends in the Z direction in the columnar body CL. The channel body 50 surrounds the insulating core 80 and extends in the Z direction along the insulating core 80. The channel body 50 is, for example, a polycrystalline silicon layer. The memory layer 70 surrounds the channel body 50 and extends in the Z direction along the channel body 50.

The memory layer 70 has a structure in which the insulating layer 71, the charge storage layer 73, and the insulating layer 75 are stacked in the lateral direction (the X-direction). The insulating layer 71 is, for example, a silicon oxide layer and acts as a blocking insulation film. The charge storage layer 73 is, for example, a silicon nitride layer. The insulating layer 75 is, for example, a silicon oxide layer and acts as a tunneling insulation film. Alternatively, the insulating layer 75 may have a structure in which silicon oxynitride (SiON) and silicon oxide are sequentially stacked from the charge storage layer 73 side.

As shown in FIG. 2A, the channel body 60 is, for example, a semiconductor containing silicon and is provided between the source layer 10 and the columnar body CL. The channel body 60 has a bottom end 60e located in the source layer 10 and is electrically connected to the source layer 10. Moreover, the channel body 50 has a bottom end 50e located in the channel body 60 and is electrically connected to the channel body 60.

As shown in FIG. 2B, a gate insulating layer 90 is provided between the channel body 60 and the selection gate 30. The gate insulating layer 90 is, for example, a silicon oxide layer and acts as a gate insulating film of the selection transistor STS.

The gate insulating layer 90 is provided, for example, by thermally oxidizing the channel body 60. The gate insulating layer 90 has a first portion 90a located in the channel body 60 and a second portion 90b positioned between the selection gate 30 and the first portion 90 a. In the embodiment, the ratio of $W_1$ to $W_G$ is made smaller than 0.44, wherein $W_1$ is a width of the first portion 90a in a lateral direction along the surface 10a of the source layer 10 (i.e. the X-direction), and $W_G$ is a width of the gate insulating layer in the lateral direction.

For example, when silicon is thermally oxidized to form a silicon oxide layer, a ratio of a thickness of silicon, which is thermally oxidized, to the total thickness of the silicon oxide layer is 0.44. Therefore, the ratio of the thickness of the portion located in the silicon to the thickness of the silicon oxide layer is 0.44. In the embodiment, the ratio of the width $W_1$ of the first portion 90a to the width $W_G$ of the gate insulating layer can be made smaller than 0.44 using the manufacturing method described later. Thereby, it is possible to enlarge a width $W_B$ of the channel body 60 in the X-direction, when the gate insulating layer 90 is formed with a predetermined thickness. Thus, it is possible to improve the strength of the channel body 60 and to suppress the generation of crystal defects due to stress and like.

As shown in FIG. 2B, the channel body 60 has a concave portion 60c facing the end surface 30c of the selection gate 30, and the first portion 90a is located in the concave portion 60c. In addition, the selection gate 30 has a recessed portion in an end surface 30c facing the channel body 60 via the gate insulating layer 90.

With reference to FIGS. 3A to 3J, a manufacturing method of the semiconductor memory device 1 is described below. FIGS. 3A to 3J are schematic cross-sectional views showing the manufacturing process of the semiconductor memory device 1 according to the first embodiment.

Figure 3A:
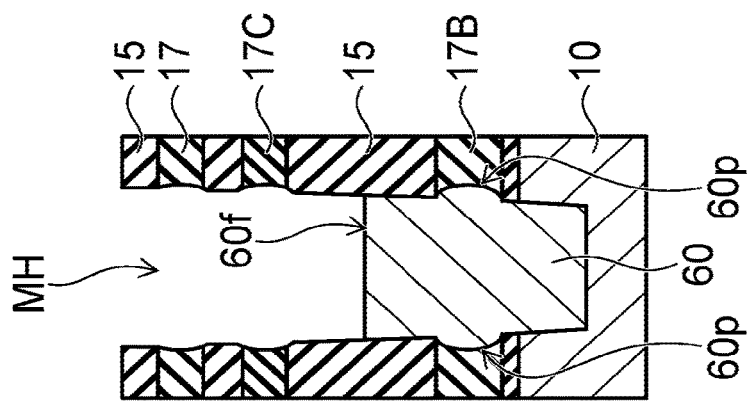

As shown in FIG. 3A, the stacked body 110 is formed on the source layer 10, and a memory hole MH is formed from the top surface of the stacked body 110 with a depth capable of reaching the source layer 10. The stacked body 110 includes an insulating layer 13, interlayer insulating layers 15 and sacrificial layers 17 stacked on the surface 10a of the source layer 10. The interlayer insulating layers 15 and the sacrificial layers 17 are alternately stacked on the insulating layer 13. The bottom surface of the memory hole MH is positioned below the surface 10a of the source layer 10.

The insulating layers 13 and 15 are silicon oxide layers formed, for example, using PCVD (Plasma enhanced Chemical Vapor Deposition). The sacrificial layers 17 are, for example, silicon nitride layers formed using PCVD.

Figure 3B:
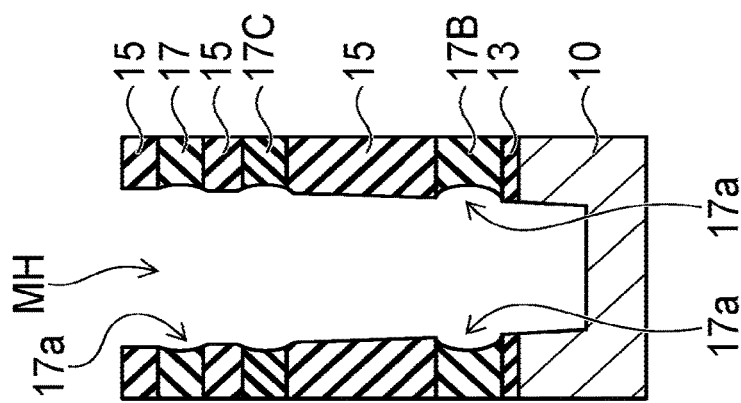

As shown in FIG. 3B, each part of the sacrificial layers 17 exposed on the inner wall of the memory hole MH is removed to form a recess 17a. The sacrificial layers 17 are removed, for example, by wet etching using hot phosphoric acid.

Figure 3C:
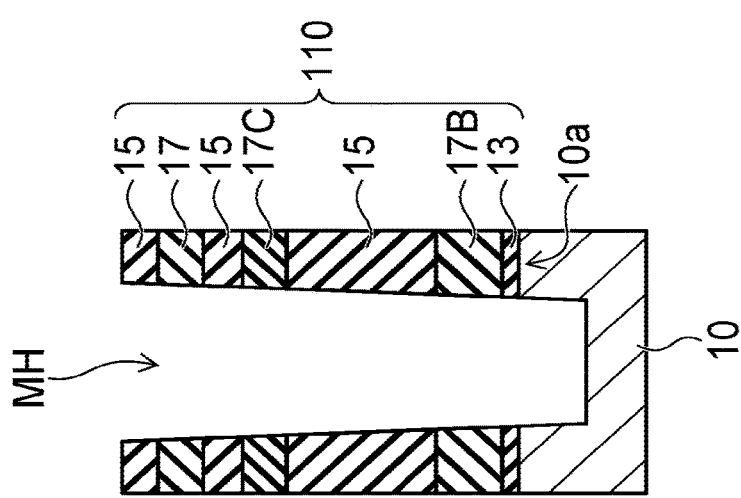

As shown in FIG. 3C, a channel body 60 is formed at the bottom of the memory hole MH. The channel body 60 is, for example, a semiconductor epitaxially grown on the source layer 10 and contains silicon. The channel body 60 is formed, for example, such that the top surface 60f is positioned at a level between the lowermost layer $17_B$ of the sacrificial layers 17 and the sacrificial layer $17_C$ adjacent thereto. The channel body 60 has a convex portion 60p which is embedded in the recessed portion of the lowermost layer $17_B$.

As shown in FIG. 3D, a memory layer 70 is formed so as to cover the inner surface of the memory hole MH and the upper surface 60f of the channel body 60. The memory layer 70 has a stacked structure including, for example, an insulating layer 71, a charge storage layer 73 and an insulating layer 75 stacked in order using ALD (Atomic Layer Deposition).

As shown in FIG. 3E, a semiconductor layer 50a is formed so as to cover the inner surface of the memory hole MH. The semiconductor layer 50a is, for example, a polycrystalline silicon layer formed using CVD. The semiconductor layer 50a is formed on the memory layer 70.

As shown in FIG. 3F, a part of the semiconductor layer 50a and a part of the memory layer 70 are selectively removed, which are formed on the top surface 60f of the channel body 60. For example, using anisotropic RIE (Reactive Ion Etching), the parts of the semiconductor layer 50a and the memory layer 70 are selectively etched leaving other parts formed on the inner wall of the memory hole MH. At this time, the other part of the semiconductor layer 50a protects the other part of the memory layer 70 formed on the inner wall of the memory hole MH.

As shown in FIG. 3G, the channel body 50 and the insulating core 80 are formed so as to fill the inside of the memory hole MH. The channel body 50 includes a semiconductor layer 50a. The channel body 50 is formed, for example, by further depositing a polycrystalline silicon layer using CVD. The bottom end 50e of the channel body 50 is positioned at a level below the top surface 60f of the channel body 60, and is electrically connected to the channel body 60. The insulating core 80 is formed, for example, by embedding silicon oxide deposited by CVD in the memory hole MH.

As shown in FIG. 3H, the sacrificial layers 17 are selectively removed. The sacrificial layers 17 are etched, for example, by supplying hot phosphoric acid through slit spaces ST (see FIG. 1). The lateral surface of the columnar body CL is exposed to the spaces $17_S$ after removing the sacrificial layers 17. Also, the convex portion 60p, which is formed on the lateral surface of the channel body 60, is exposed in the space $17_{SB}$ from which the lowermost sacrificial layer 17 is removed.

As shown in FIG. 3I, a gate insulating layer 90 is formed by thermally oxidizing the lateral surface of the channel body 60 exposed in the space $17_{SB}$. At this time, all convex portion 60p is oxidized and included in the second portion 90b (see FIG. 2B) of the gate insulating layer 90. As a result, the ratio of $W_1$ to $W_G$ is smaller than 0.44, wherein $W_1$ is the width in the X direction of the first portion located in the channel body 60, and $W_G$ is the width of the gate insulating layer 90 in the X direction (see FIG. 2B). In other words, the progress of oxidization into the channel body 60 is suppressed by the convex portion 60p, and the width $W_B$ (see FIG. 2B) of the channel body 60 can be enlarged as compared with the case where the convex portion 60p is not formed.

As shown in FIG. 3J, word lines 20 and selection gate 30 are formed in the spaces 17S and 17SB respectively to complete the memory cell array MCA. The word lines 20 and selection gate 30 are formed, for example, by depositing a metal layer using CVD. The raw material gas of CVD is supplied, for example, through slit spaces ST (see FIG. 1).

Second Embodiment

Figure 4A:
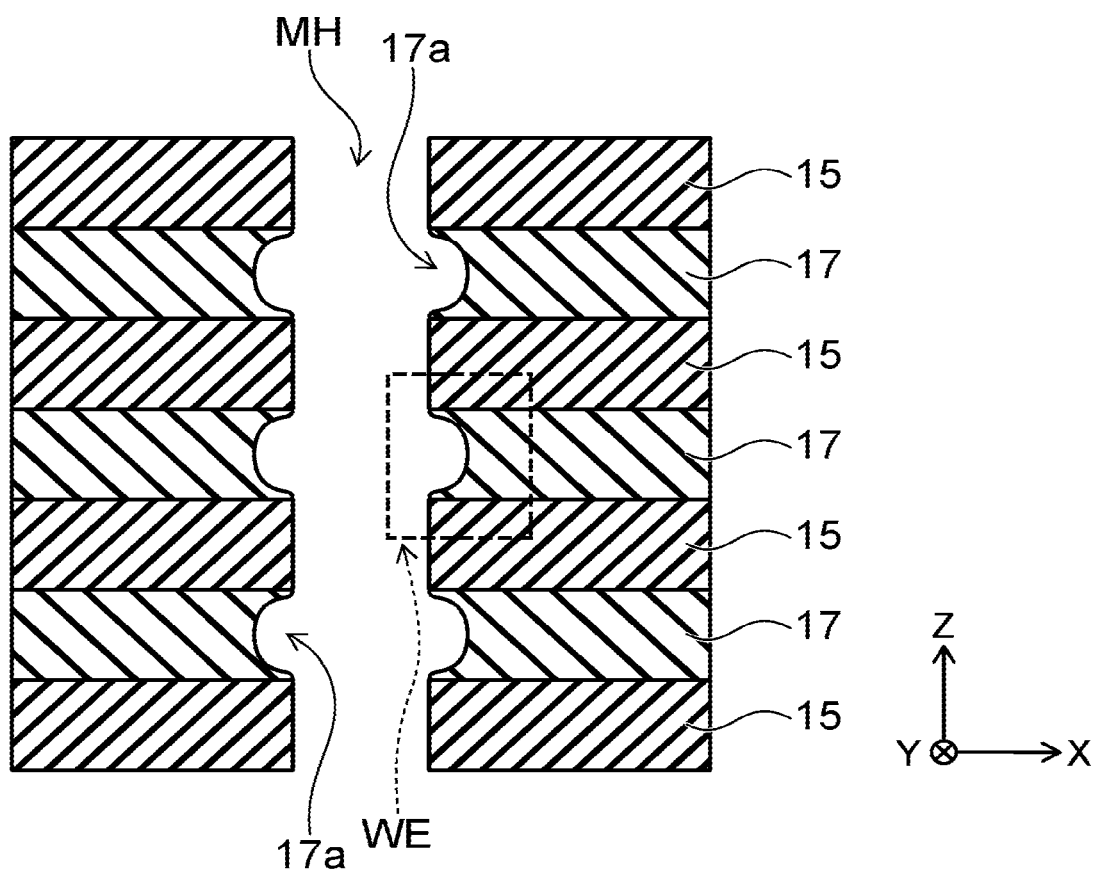

FIGS. 4A to 4G are schematic cross-sectional views showing a manufacturing process of the semiconductor memory device 1 according to the second embodiment. FIG. 4A is a schematic view showing cross sections of the interlayer insulating layers 15 and the sacrificial layers 17 stacked in the Z direction. FIGS. 4B to 4G are cross-sectional views corresponding to the region WE shown in FIG. 4A.

As shown in FIG. 4A, parts of the sacrificial layers 17 are selectively removed through the memory hole MH to form the recessed portions 17a. The interlayer insulating layers 15 are, for example, silicon oxide layers, and the sacrificial layers 17 are, for example, silicon nitride layers.

The interlayer insulating layers 15 and the sacrificial layers 17 may be stacked, for example, on a P-type well provided on a silicon substrate. Moreover, the interlayer insulating layers 15 and the sacrificial layers 17 may be stacked, for example, on a polycrystalline silicon layer disposed above a circuit provided on a silicon substrate. The memory hole MH extends in the Z direction through the interlayer insulating layers 15 and the sacrificial layers 17.

Figure 4B:
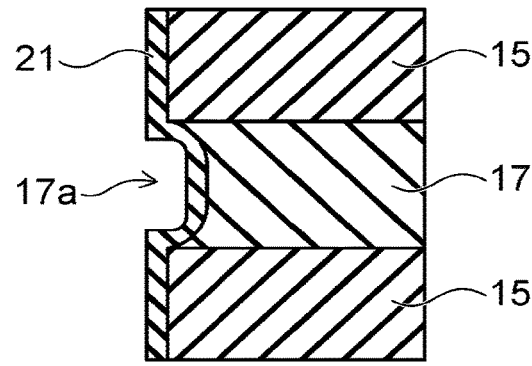

As shown in FIG. 4B, a silicon nitride layer 21 is formed to cover the inner surface of the memory hole MH (see FIG. 4A). The silicon nitride layer 21 also covers an inner surface of a recessed portion 17a. The silicon nitride layer 21 is formed, for example, using ALD.

Figure 4C:
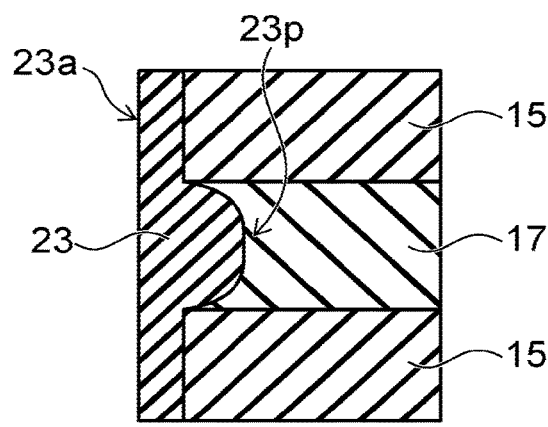

As shown in FIG. 4C, an insulating layer 23 is formed to cover the inner surface of the memory hole MH (see FIG. 4A). The insulating layer 23 is formed, for example, by oxidizing the silicon nitride layer 21 with radical oxygen. The insulating layer 23 is, for example, a silicon oxide layer. Moreover, the insulating layer 23 includes a convex portion 23p obtained by oxidizing a part of the sacrificial layer 17. That is, the oxidation by radical oxygen also proceeds into the sacrificial layer 17, and converts silicon nitride contained in the sacrificial layer 17 into silicon oxide or silicon oxynitride.

When silicon nitride is converted to silicon oxide, the volume thereof expands, for example, to 1.4 times. Thus, the layer thickness of the insulating layer 23 formed on the end face of the interlayer insulating layers 15 is 1.4 times the thickness of the silicon nitride layer 21. In contrast, the width of the convex portion 23p in the X direction may be enlarged in the recessed portion 17a (see FIG. 4B), for example, by prolonging the oxidation time and thus, increasing the oxidation amount.

Figure 5:
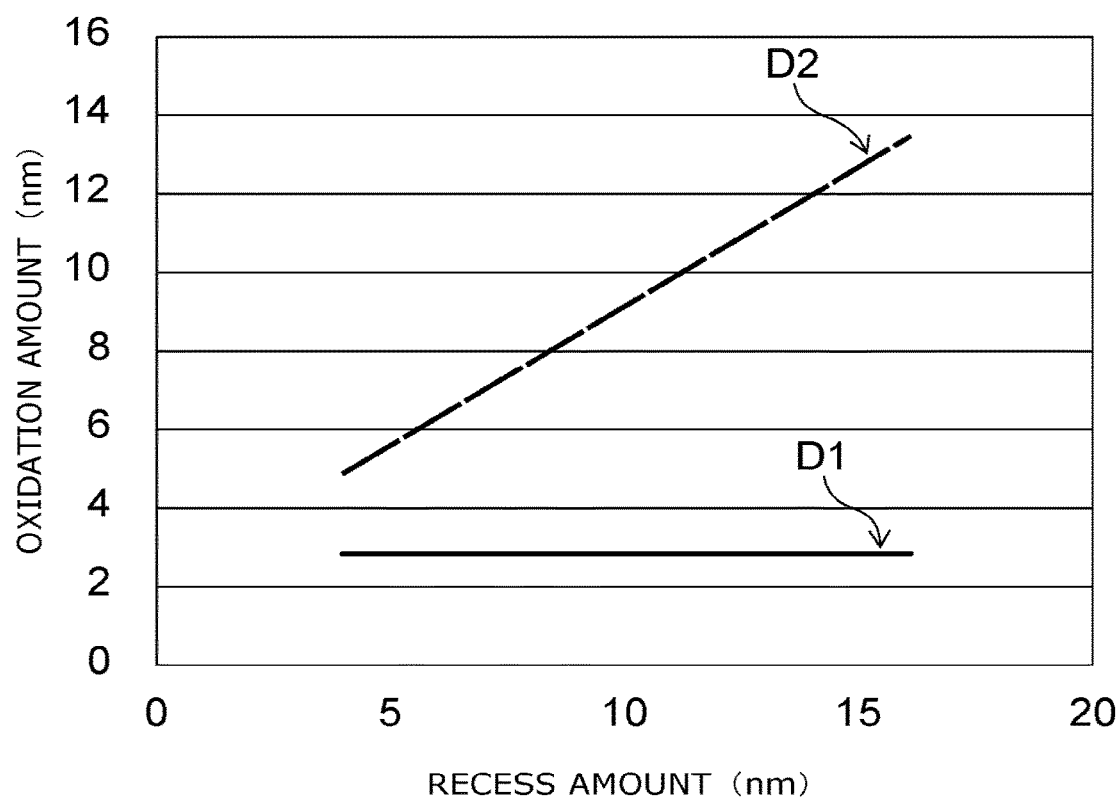
FIG. 5 is a graph showing process conditions according to the second embodiment.

FIG. 5 shows the relationship between the recess amount (i.e. the depth in the X direction of the recessed portion 17a) and the oxidation amount of the silicon nitride layer. D1 shown in FIG. 5 indicates the oxidation amount for converting entire parts of the silicon nitride layer 21 into silicon oxide, which are formed on the end faces of the interlayer insulating layers 15. D2 indicates the oxidation amount when the recess portion 17a disappears due to the expansion of the silicon oxide formed by the oxidation of silicon nitride and thus, the surface 23a of the insulating layer 23 is planarized.

For example, by setting the oxidation amount in the radical oxidation of the silicon nitride layer 21 to an amount between D1 and D2, the part of the insulating layer 23 formed on the end surface of the sacrificial layer 17 can be formed so as not to protrude into the memory hole MH. Thereby, it is possible to avoid the charge storage layer 25 and the insulating layer 27 being damaged by anisotropic RIE, which are formed on the insulating layer 23 (see FIGS. 3F and 4D).

Figure 4D:
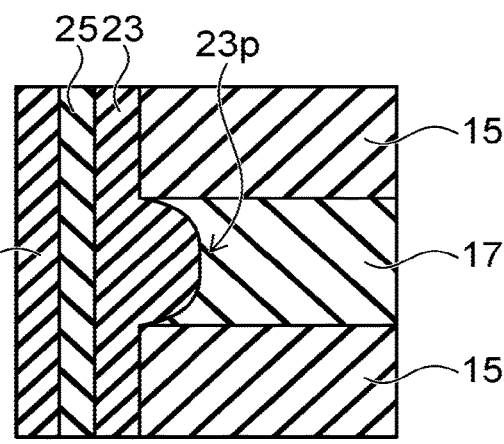

As shown in FIG. 4D, the charge storage layer 25 and the insulating layer 27 are formed on the insulating layer 23. The charge storage layer 25 is, for example, a silicon nitride layer, and the insulating layer 27 is, for example, a silicon oxide layer. The charge storage layer 25 and the insulating layer 27 are formed, for example, using ALD.

As shown in FIG. 4E, a channel body 50 is formed on the insulating layer 27. The channel body 50 is, for example, a polycrystalline silicon layer, and is formed using CVD.

As shown in FIG. 4F, the sacrificial layer 17 is selectively removed to form a space 17s. In the space 17s, the convex portion 23p of the insulating layer 23 is exposed. Subsequently, as shown in FIG. 4G, the word line 20 is formed inside the space 17S to complete the memory cell array MCA.

Figure 6A:
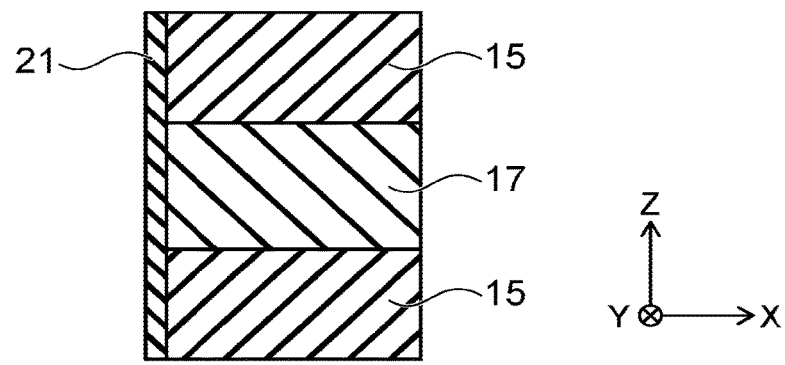
FIGS. 6A to 6C are schematic cross-sectional views showing a manufacturing process of a semiconductor memory device according to a comparative example.
Figure 6B:
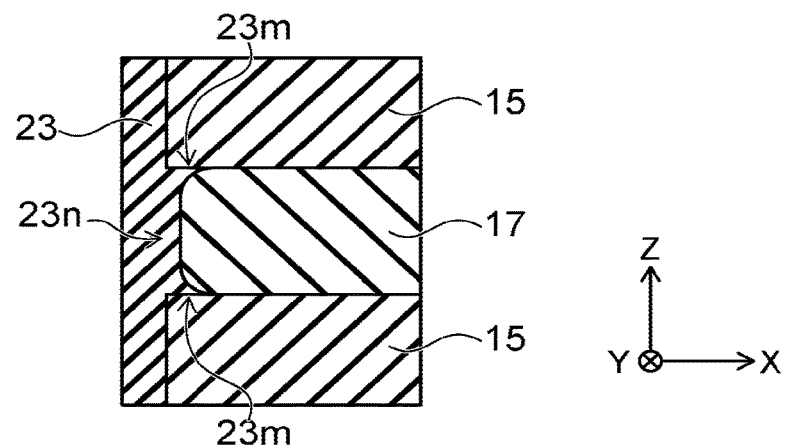
Figure 6C:
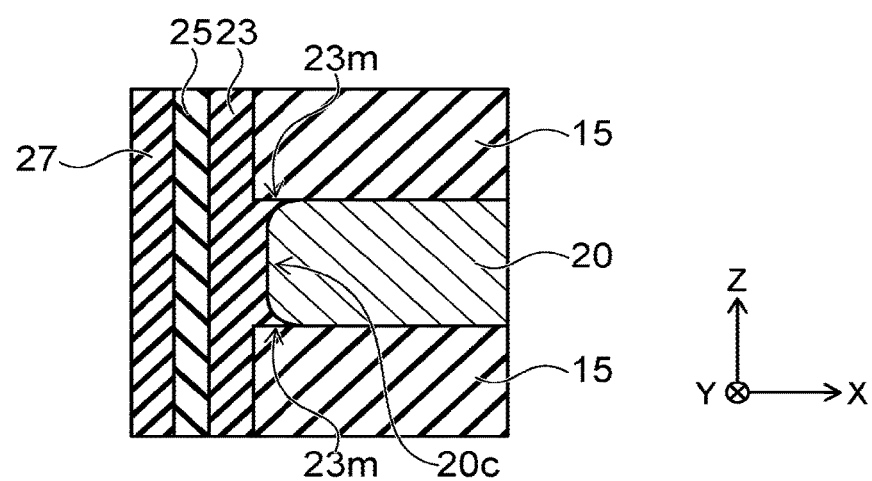

FIGS. 6A to 6C are schematic cross-sectional views showing a manufacturing process of the semiconductor memory device 1 according to a comparative example. In FIGS. 6A to 6C, a cross section is shown, which corresponds to the region WE shown in FIG. 4A. In this example, the recessed portion 17a is not provided on the inner wall of the memory hole MH (see FIG. 4A). Accordingly, the silicon nitride layer 21 is formed on a flat inner wall as shown in FIG. 6A.

Subsequently, as shown in FIG. 6B, the insulating layer 23 is formed by the radical-oxidization of the silicon nitride layer 21. The insulating layer 23 is, for example, a silicon oxide layer and includes the oxidized portion 23n of the sacrificial layer 17. In this case, the sacrificial layer 17 is oxidized not only by radical oxygen penetrating through the end face thereof, but also by radical oxygen penetrating through the end face of the interlayer insulating layer 15. Thereby, the oxidation is facilitated at the interface between the interlayer insulating layer 15 and the sacrificial layer 17 comparing with the end face, and thus, so-called bird's beak 23m is formed.

As a result, the end portion of the word line 20 that replaces the sacrificial layer 17 has a shape having the end face 20c protruding toward the charge storage layer 25 side as shown in FIG. 6C. That is, the width in the Z direction of the end face, which faces the charge storage layer 25 of the word line 20, is substantially narrowed. Therefore, a short channel effect such as the increase of threshold voltage or the like may occur more significantly, when the thickness in the Z direction of the word line 20 decreases, for example, due to miniaturization of the memory cell array MCA.

In contrast to this, in the manufacturing process of the semiconductor memory device 1 according to the embodiment, the recess portion 17a is provided in the memory hole MH, and the end face of the sacrificial layer 17 is set back from the end face of the interlayer insulating layer 15. Thereby, it is possible to suppress the influence of radical oxygen entering from the end face of the interlayer insulating layer 15, and to prevent the formation of the bird's beak 23m. As a result, as shown in FIG. 4G, the end face 20c can be depressed, for example, at the end of the word line 20.

That is, it is possible to make the interior angle θ between the end surface 20c and the surface 20a or 20b to be less than 90 degrees at the portions where the surfaces 20a and 20b of the word line 20, which face the interlayer insulating layers 15 respectively, are connected to the end surface 20c. It is also possible to realize a square end with θ=90 degrees. Thereby, the short channel effect may be suppressed, and variations in the threshold voltage of the memory cell MC may be suppressed, for example.

Figure 7A:
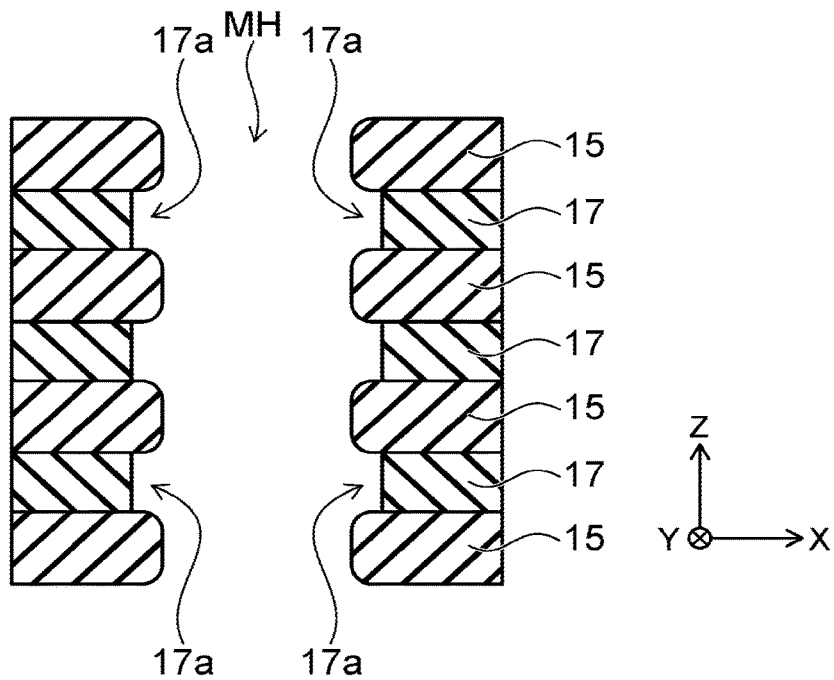
FIGS. 7A to 7F are schematic cross-sectional views showing a manufacturing process of a semiconductor memory device according to a variation of the second embodiment.
Figure 7B:
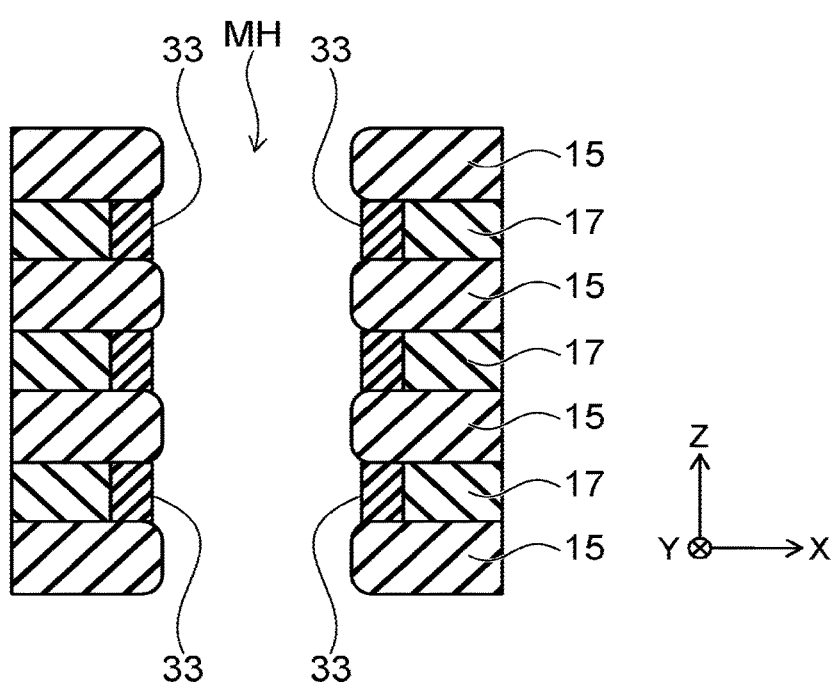
Figure 7C:
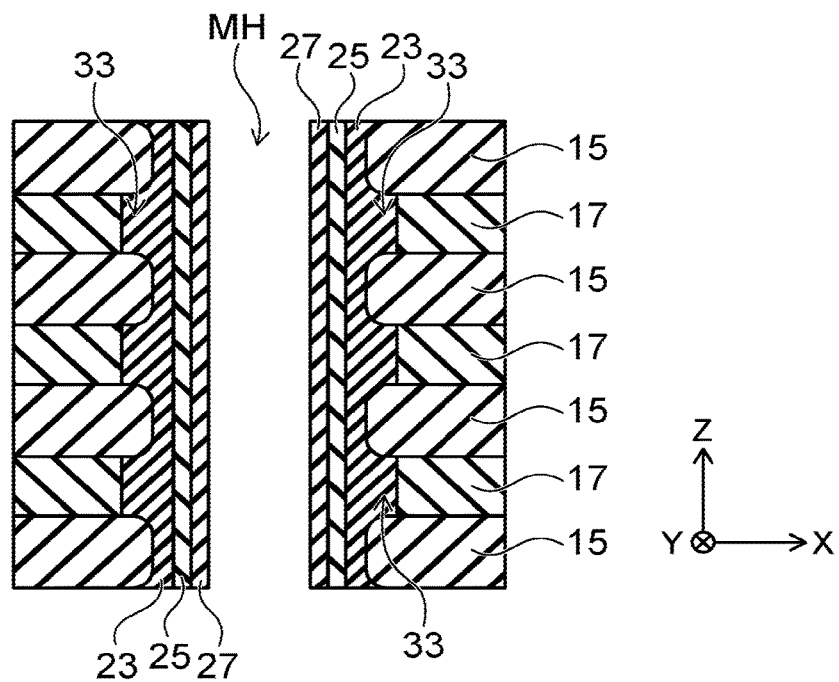
Figure 7D:
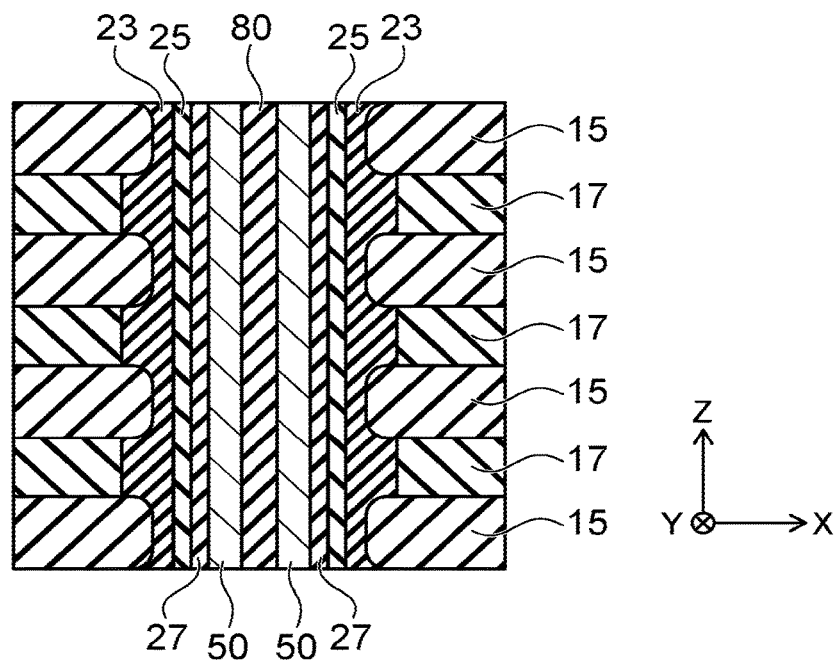
Figure 7E:
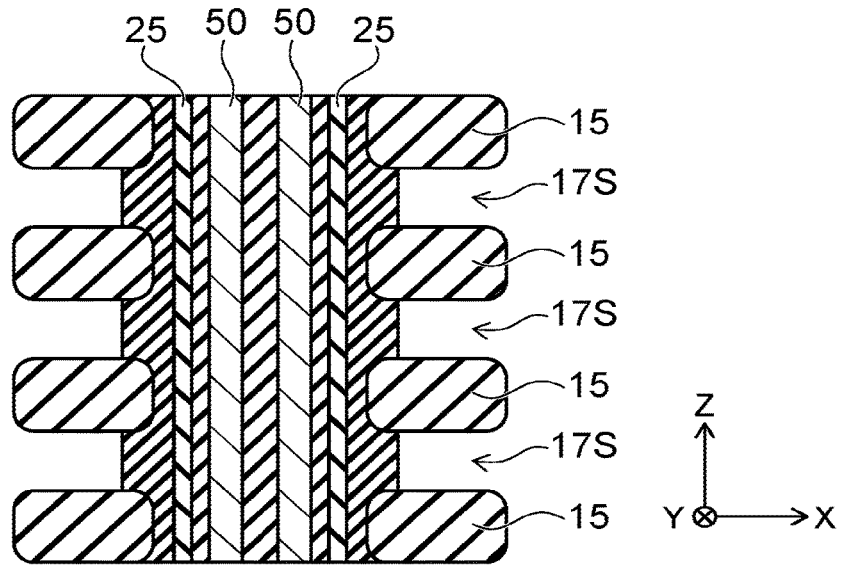
Figure 7F:
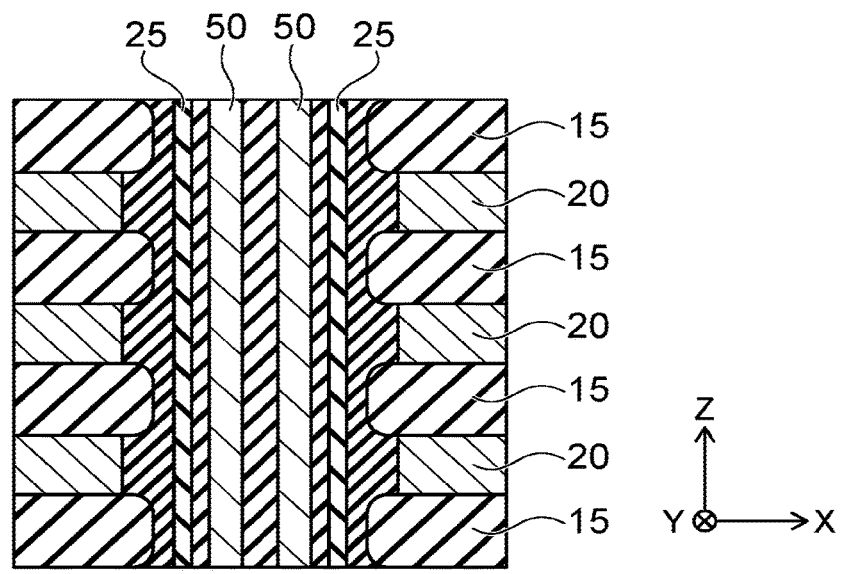

FIGS. 7A to 7F are schematic cross-sectional views showing a manufacturing process of the semiconductor memory device 1 according to a variation of the second embodiment. FIGS. 7A to 7D are schematic views showing a cross section of the interlayer insulating layers 15 and the sacrificial layers 17 stacked in the Z direction. FIGS. 7E and 7F are schematic views showing the cross section after removing the sacrificial layers 17 and after forming the word lines 20.

As shown in FIG. 7A, parts of the sacrificial layers 17 are selectively removed through the memory hole MH to form the recessed portions 17a. The interlayer insulating layers 15 are, for example, silicon oxide layers, and the sacrificial layers 17 are, for example, silicon nitride layers.

As shown in FIG. 7B, the oxidation layers 33 are formed in the recessed portions 17a respectively by radical-oxidization of the end surfaces of the sacrificial layers 17. The oxide layers 33 are, for example, silicon oxide layers, and are formed, for example, such that the end surfaces of the oxide layers 33 are positioned at the same level in the X direction as the end faces of the interlayer insulating layers 15, or are located at a position set back in the X direction from the end surfaces of the interlayer insulating layers 15.

As shown in FIG. 7C, the insulating layer 23, the charge storage layer 25 and the insulating layer 27 are formed in order on the inner wall of the memory hole MH. The insulating layer 23 is, for example, a silicon oxide layer, and is joined with the oxide layer 33. The charge storage layer 25 is, for example, a silicon nitride layer, and the insulating layer 27 is, for example, a silicon oxide layer.

As shown in FIG. 7D, a channel body 50 is formed on the insulating layer 27, and then, an insulating core 80 is formed such that the memory hole MH is filled therewith. The channel body 50 is, for example, a polycrystalline silicon layer, and the insulating core 80 is, for example, silicon oxide.

As shown in FIG. 7E, the sacrificial layers 17 are selectively removed to form spaces 17s. Subsequently, as shown in FIG. 7F, the word lines 20 are formed in the spaces 17s to complete the memory cell array MCP. In addition, selection gates 30 and 40 are also formed in a portion not shown.

Also in this example, it is possible to prevent the formation of bird's beak 23m during the radical oxidation of the sacrificial layers 17 by forming the recessed portion 17a on the inner wall of the memory hole MH (see FIG. 7B). Thereby, the short channel effect of the memory cell MC can be suppressed by making the end portions of the word lines 20 to be formed into a rectangular shape or to have a shape having a recessed end surface.

The examples are described above, according to the first embodiment and the second embodiment, without an intention to limit the inventions thereto. In the first embodiment, for example, the sacrificial layers 17 may be subjected to the radical oxidation when forming the insulating layer 71 of the memory layer 70, or in the second embodiment, the channel body 60 may be formed at the bottom of the memory hole MH.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device comprising:
  a conductive layer;

a first electrode layer provided above the conductive layer;

a second electrode layer provided between the conductive layer and the first electrode layer;

a first semiconductor channel body extending through the first electrode layer in a first direction from the conductive layer to the first electrode layer;

a second semiconductor channel body provided between the conductive layer and the first semiconductor channel body, the second semiconductor channel body extending through the second electrode layer; and an insulating layer provided between the second semiconductor channel body and the second electrode layer, the second semiconductor channel body including a first recessed portion in a lateral surface facing the second electrode layer, and the second electrode layer including a second recessed portion in a surface facing the second semiconductor channel body.

2. The semiconductor memory device according to claim 1, wherein the insulating layer includes a first portion located in the first recessed portion of the second semiconductor channel body, and a ratio of a width, in a second direction along a front surface of the conductive layer, of a first portion of the insulating layer to the width in the second direction of the insulating layer is smaller than 0.44.

3. The semiconductor memory device according to claim 1, wherein the second semiconductor channel body is electrically connected to the first semiconductor channel body and the conductive layer.

4. The semiconductor memory device according to claim 3, wherein the first semiconductor channel body has an end portion located in the second semiconductor channel body.

5. The semiconductor memory device according to claim 3, wherein the second semiconductor channel body has an end portion located in the conductive layer.

6. The semiconductor memory device according to claim 1, further comprising:

a charge storage layer positioned between the first semiconductor channel body and the first electrode layer.

* * * * *